United States Patent
Gay et al.

(10) Patent No.: US 10,446,593 B2
(45) Date of Patent: Oct. 15, 2019

(54) IMAGE SENSOR CHIP

(71) Applicant: STMicroelectronics (Crolles 2) SAS, Crolles (FR)

(72) Inventors: Laurent Gay, Lumbin (FR); Francois Guyader, Montbonnot (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/172,044

(22) Filed: Oct. 26, 2018

(65) Prior Publication Data
US 2019/0067342 A1 Feb. 28, 2019

Related U.S. Application Data

(62) Division of application No. 15/600,962, filed on May 22, 2017, now Pat. No. 10,147,748.

(30) Foreign Application Priority Data

Nov. 24, 2016 (FR) .................................... 16 61440

(51) Int. Cl.
*H01L 27/144* (2006.01)
*H01L 27/146* (2006.01)

(52) U.S. Cl.
CPC ...... *H01L 27/1446* (2013.01); *H01L 27/1464* (2013.01); *H01L 27/14632* (2013.01); *H01L 27/14636* (2013.01); *H01L 27/14687* (2013.01)

(58) Field of Classification Search
None
See application file for complete search history.

(56) References Cited

U.S. PATENT DOCUMENTS

| | | |
|---|---|---|
| 2011/0037137 A1 | 2/2011 | Wehbe-Alause |
| 2012/0267690 A1 | 10/2012 | Endo et al. |
| 2013/0255738 A1 | 10/2013 | Mitrovic et al. |
| 2014/0217486 A1 | 8/2014 | Akiyama |
| 2015/0008555 A1 | 1/2015 | Mizuta et al. |

FOREIGN PATENT DOCUMENTS

| | | |
|---|---|---|
| EP | 2284894 A1 | 2/2011 |
| EP | 2747139 A1 | 6/2014 |
| WO | 2015111419 A2 | 7/2015 |

OTHER PUBLICATIONS

INPI Search Report and Written Opinion for FR 1661440 dated Jul 5, 2017 (8 pages).

*Primary Examiner* — Bo B Jang
(74) *Attorney, Agent, or Firm* — Crowe & Dunlevy

(57) ABSTRACT

An image sensor chip includes a semiconductor layer intended to receive illumination on a back face and comprising a matrix of pixels on a front face. An interconnection structure is arranged on the front face and a carrier is attached to the interconnection structure with a first face of the carrier facing the front face. An annular trench, arranged on a perimeter of the image sensor chip, extends from a second face of the carrier through an entire thickness of the carrier and into the interconnection structure. A via opening, arranged within the annual trench, extends from the second face of the carrier through the entire thickness of the carrier to reach a metal portion of the interconnection structure. The via opening an annual trench are lined with an insulating layer. The via opening include a metal conductor making an electrical connection to the metal portion.

28 Claims, 3 Drawing Sheets

IMAGE SENSOR CHIP

CROSS REFERENCE TO RELATED APPLICATIONS

This application is a divisional application from U.S. patent application Ser. No. 15/600,962 filed May 22, 2017, which claims the priority benefit of French Application for Patent No. 1661440, filed on Nov. 24, 2016, the disclosures of which are hereby incorporated by reference in their entireties.

TECHNICAL FIELD

Embodiments relate to an image sensor chip and a method for the manufacture thereof.

BACKGROUND

A back-illuminated image sensor chip comprises a semiconductor layer, one face of which, referred to as the front face, is covered with an interconnection structure, and the face of which that is opposite the front face, referred to as the back face, is intended to receive illumination. The chip comprises a matrix of pixels, formed in and on the semiconductor layer, elements of which, such as transistors, are formed on the side of the front face and are connected to each other via the interconnection structure.

A chip of this kind is manufactured from a semiconductor die or layer. In practice, a plurality of identical chips are formed simultaneously in this die, which is then sliced in order to obtain individual chips. Before slicing, a handle or carrier is bonded to the side of the interconnection structures formed on the front face of the semiconductor die, and then the die is thinned from its back face. After thinning of the semiconductor die, for each chip, conductive connecting vias are formed through the handle, as far as portions of the upper level of metallizations of the interconnection structure of this chip. The semiconductor die provided with the handle is then sliced in order to obtain individualized chips.

In a chip manufactured in the manner described above, after the step of slicing or sawing, delaminations may be observed at the bonding interface of the handle on the interconnection structure. These delaminations extend from the edges of the chip and may propagate over a large part of the bonding interface. This may result in malfunctioning of the chip, in particular on account of rupturing of one or more conductive connecting vias.

There is a need in the art for a back-illuminated image sensor chip comprising means for preventing the propagation of delaminations at the bonding interface of the handle on the interconnection structure. It would also be desirable to have a method for manufacturing a chip of this kind that comprises few or no additional steps with respect to a conventional manufacturing method.

SUMMARY

An embodiment provides an image sensor chip comprising a semiconductor layer intended to receive illumination on the side of its back face and comprising a matrix of pixels, an interconnection structure arranged on the front face of the semiconductor layer and electrically connecting the elements of the matrix of pixels to each other, a carrier arranged on the interconnection structure, a first face of said carrier being on the side of the front face, and an annular trench arranged on the perimeter of the chip, said trench extending from the second face of the carrier through the entire thickness of the carrier.

According to one embodiment, the carrier comprises a first layer of silicon oxide at its first face, the trench passing through the first layer.

According to one embodiment, a second layer of silicon oxide is arranged on the interconnection structure, the first face of the carrier is arranged on and in contact with the second layer, and the trench extends through all or part of the thickness of the second layer.

According to one embodiment, the chip comprises conductive vias extending from the second face of the carrier and passing through the carrier as far as portions of a level of metallizations of the interconnection structure.

According to one embodiment, the trench is not as deep as the vias.

According to one embodiment, the trench surrounds all of said vias.

According to one embodiment, the trench does not penetrate into the interconnection structure.

Another embodiment provides a method for manufacturing image sensor chips, comprising the following successive steps: a) providing a wafer comprising a semiconductor die, interconnection structures arranged on a front face of the semiconductor die, matrices of pixels formed in the semiconductor die, each chip comprising a matrix, elements of which that are formed on the side of the front face being connected to each other via a corresponding interconnection structure, b) bonding, on the side of the interconnection structures, a first face of a handle to the wafer, c) for each chip, engraving, from the second face of the handle, an annular trench on the perimeter of the chip, the trench passing through the entire thickness of the handle, and d) slicing the wafer into chips, the edge of each chip being arranged beyond the annular trench of said chip.

According to one embodiment, in step b), a first layer of silicon oxide is formed at the first face of the handle, and, in step c), for each chip, the annular trench is engraved through the first layer.

According to one embodiment, in step a), a second layer of silicon oxide is formed on the interconnection structures, and, in step b), the first face of the handle is bonded on the second layer, the trench of each chip being engraved through all or part of the thickness of the second layer.

According to one embodiment, the method furthermore comprises, in step c), the formation of conductive vias comprising the following successive steps: for each chip, engraving holes from the second face of the handle made of silicon as far as portions of a level of metallizations of the interconnection structure of this chip, forming an insulating layer on the side of the second face of the handle, said insulating layer covering the walls and the base of the holes and of the trench of each chip, removing the portions of the insulating layer at the base of the holes, and forming a conductive layer on the walls and the base of each hole.

According to one embodiment, the trenches and the holes are engraved simultaneously.

According to one embodiment, in step c), the engraving of the trenches is interrupted before the interconnection structures.

According to one embodiment, in step b), after bonding of the handle, the semiconductor die is thinned from its back face.

According to one embodiment, between steps c) and d), a transparent carrier is bonded to the wafer, on the side of the back face of the semiconductor die, the handle then being thinned from its second face.

BRIEF DESCRIPTION OF THE DRAWINGS

These and other features and advantages will be disclosed in detail in the following description of particular embodiments, which is given in a non-limiting manner, in relation to the appended figures, in which.

DETAILED DESCRIPTION

Like elements have been denoted using the same references in the different figures and, moreover, the various figures are not drawn to scale. For the sake of clarity, only those elements that are useful for understanding the embodiments described have been shown and are detailed.

In the following description, the terms "below", "upper", "lower" etc. refer to the orientation of the elements in question in the corresponding figures. Unless indicated otherwise, the terms "substantially" and "approximately" signify to within 10%, preferably to within 5%.

FIGS. 1A to 1D illustrate successive steps of an example of a method for manufacturing back-illuminated image sensor chips. More particularly, these figures are schematic cross-sectional views of a portion of one of the chips manufactured using this method, it being understood that, in practice, a plurality of identical chips are manufactured simultaneously from one and the same semiconductor die or layer.

Figure 1A:
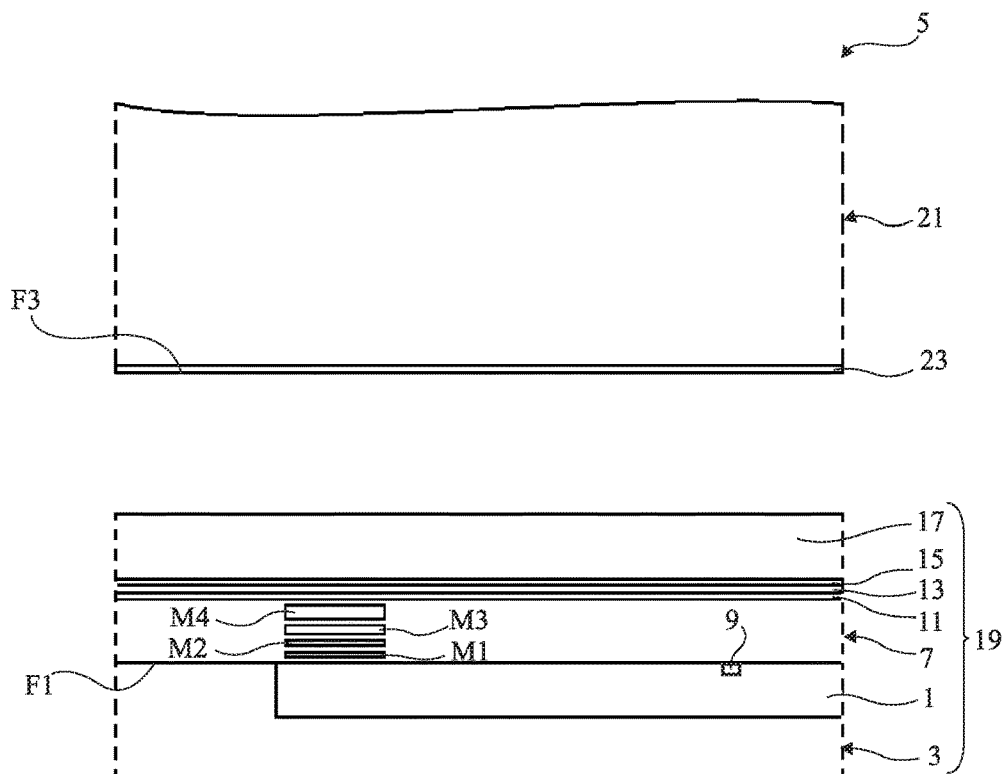
FIGS. 1A to 1D schematically illustrate successive steps of an example of a method for manufacturing a back-illuminated image sensor chip.

In the step in FIG. 1A, at the bottom in this figure, matrices of pixels 1 have been formed on the side of the front face F1 of a semiconductor die 3, for example made of silicon, each chip 5 comprising a matrix of pixels 1. An interconnection structure 7 has been formed on the front face F1 of the semiconductor die 3. The interconnection structure 7 comprises levels of metallizations, for example four levels M1, M2, M3 and M4 of metallizations, embedded in insulating layers and connected to each other by conductive vias. Each chip 5 comprises an interconnection structure 7 for connecting the elements of its matrix of pixels 1 to each other, for example transistors 9, formed on the side of the front face F1 of the semiconductor die 3. In practice, the interconnection structures of all of the chips of the semiconductor die 3 are formed simultaneously. Optional insulating layers 11, 13, 15 and 17 have been formed successively on the upper face of the interconnection structures 7.

The assembly consisting of the semiconductor die 3, the interconnection structures 7 arranged on its front face F1, and the optional layers 11, 13, 15 and 17 formed on the interconnection structures forms a wafer 19.

By way of example, the thickness of the die 3 may be between 600 μm and 1 mm. The thickness of the interconnection structures 7 may be between 1 μm and 5 μm, for example 2 μm. The layer 11 is, for example, a layer of silicon nitride, the thickness of which may be between 20 and 100 nm, for example 40 nm. The insulating layer 13 is, for example, a layer of phosphorus-doped silica, or PSG (phosphosilicate glass), the thickness of which may be between 100 and 500 nm, for example 250 nm. The layer 15 is, for example, a layer of silicon nitride, the thickness of which may be between 250 nm and 750 nm, for example 500 nm. The layer 17 is, for example, a layer of silicon oxide, the thickness of which may be greater than 0.5 μm, or even greater than 1 μm, for example 2 μm. The layer 17 is formed, for example, by deposition, for example by chemical vapor deposition or CVD, for example from tetraethoxysilane (TEOS).

With continuing reference to the step in FIG. 1A, at the top in this figure, a handle or carrier 21 made of silicon is provided. The handle 21 comprises an optional layer of silicon oxide 23 arranged at its lower face F3. The thickness of the layer of silicon oxide 23, for example formed by thermal oxidation, may be between 20 and 50 nm, for example 30 nm.

Figure 1B:
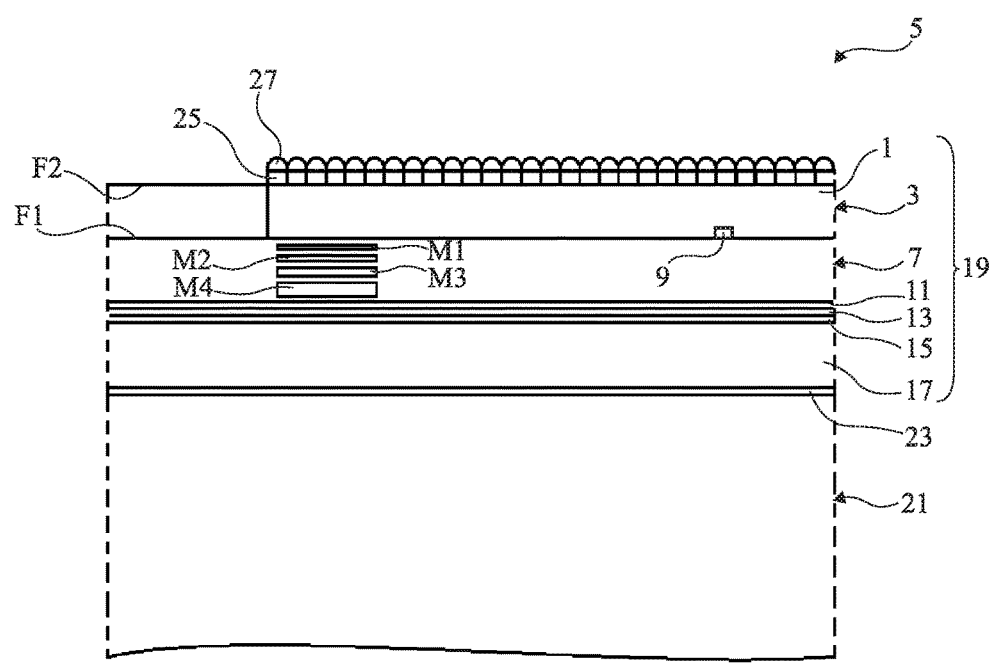

In the step in FIG. 1B, the handle made of silicon 21 has been bonded to the wafer 19 by molecular bonding, on the side of the interconnection structures 7. More particularly, in this embodiment, the layer of silicon oxide 23 of the handle 21 has been bonded to the layer of silicon oxide 17 of the wafer 19, the two layers 23 and 17 thus being in contact with each other. The wafer 19 provided with the handle 21 has been flipped, and then the semiconductor die 3 has been thinned from its back face F2, for example to a thickness of between 2 and 10 μm, for example 5 μm.

Optional color filters 25 have been formed on the back face F2 of the thinned die 3, facing the matrix of pixels 1 of each of the chips 5. Each filter 25 has been covered with an optional microlens 27, each microlens 27 being associated with a pixel of a matrix 1.

Figure 1C:
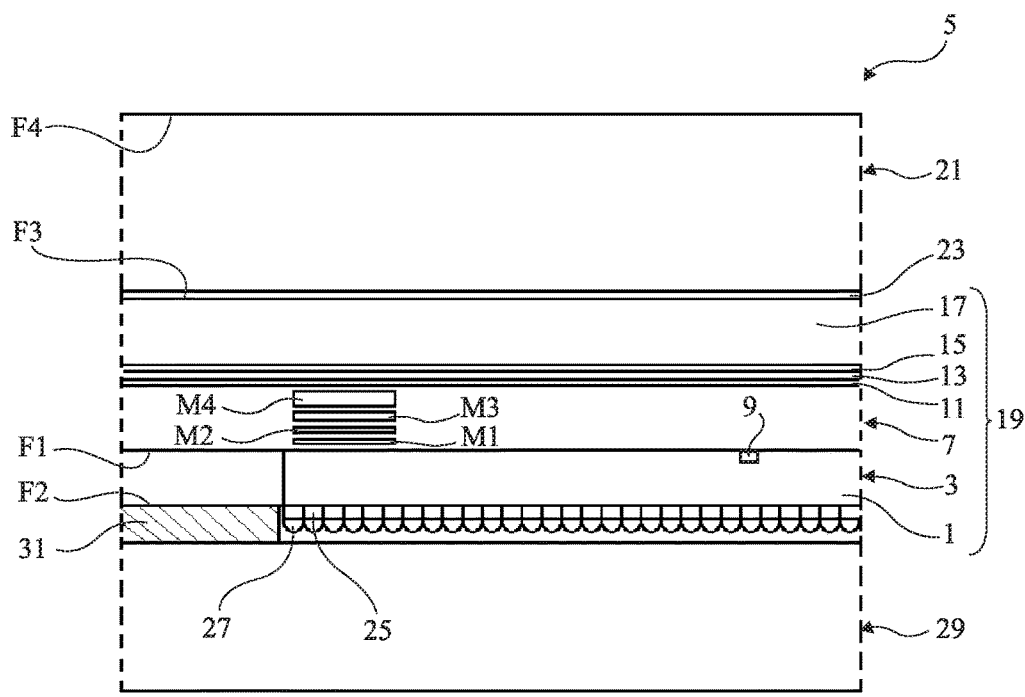

In the step in FIG. 1C, a carrier 29 that is transparent to the rays intended to be received by the pixels of the chips 5 has been bonded to the wafer 19, on the side of the back face F2 of the thinned semiconductor die 3. The carrier 29, for example made of glass, may have a thickness of between 200 and 700 μm, for example 500 μm. The wafer 19 provided with the carrier 29 and with the handle 21 has been flipped. The handle 21 has then been thinned from its upper face F4 to a thickness that makes it possible to produce conductive connecting vias that pass through the entire thickness of the handle 21. By way of example, the handle 21 is thinned to a thickness of less than or equal to 150 μm, for example less than or equal to 70 μm.

In this embodiment, the transparent carrier 29 is bonded to the wafer 19 by means of a layer of adhesive 31, for example a polymer adhesive. The adhesive 31 is arranged on the side of the back face F2 of the semiconductor die 3, at the periphery of each chip 5, so as not to cover the microlenses 27 and affect the operation thereof. In one variant embodiment, the microlenses 27 are omitted and the adhesive 31 may then be provided over the entirety of the back face F2 of the semiconductor die 3.

Figure 1D:
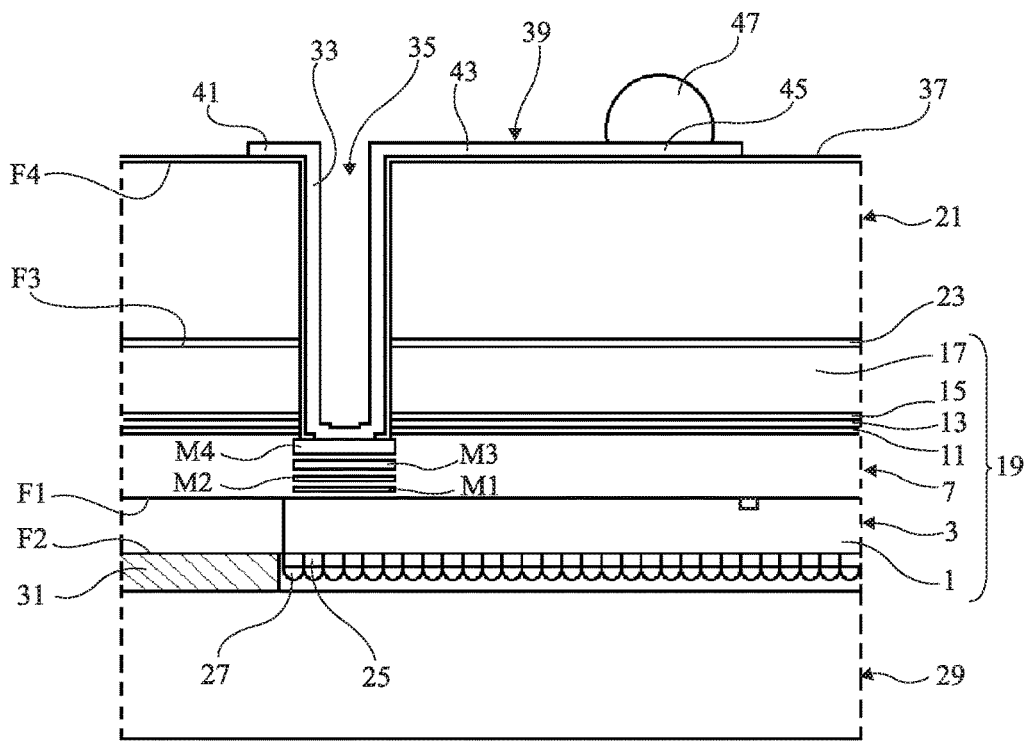

In the step in FIG. 1D, for each chip 5, conductive connecting vias 33 have been formed through the handle 21, as far as portions of the upper level M4 of metallizations of the interconnection structure 7 of this chip 5. A single via 33 is shown in FIG. 1D.

In order to form these conductive vias 33, holes 35 are engraved from the upper face F4 of the handle 21 until reaching portions of the upper level M4 of metallizations of the interconnection structures 7. By way of example, the width or diameter of the holes 35 is approximately 70 μm. An insulating layer 37, for example a layer of silicon oxide, silicon nitride and/or silicon oxynitride, is formed on the side of the upper face F4 of the handle 21 so as to cover the handle 21, the walls and the base of the holes 35. The portions of the insulating layer 37 that are arranged at the base of the holes 35 are removed in order to expose corresponding portions of the upper level M4 of metallizations. A conductive layer 39, for example made of a metal such as copper or tungsten, is then formed on the walls and the base of each hole 35. By way of example, the conductive layer 39 is formed by deposition on the side of the upper face F4 of the handle 21, and is then removed by engraving while leaving in place, on the walls and the base of each hole 35, portions of this layer 39 forming a conductive via 33. During the engraving of the conductive layer 39, an annular portion 41 of the layer 39 may be left in place around each via 33, on the upper face F4 of the handle 21. In this embodiment, portions of the conductive layer 39 are also left in place on the upper face F4 of the handle 21, level with a central portion of each chip 5, so as to form conductive tracks 43 and conductive pads 45 there. The tracks 43 extend from the vias 33 as far as the pads 45, and conductive balls 47 may be formed on the conductive pads 45. Thus, each ball 47 is connected electrically to a portion of the upper level M4 of metallizations of an interconnection structure 7.

In a step that is not illustrated, the wafer 19 provided with the handle 21 and with the carrier 29 is sliced along the contours of each chip 5 in order to obtain a plurality of individualized chips 5.

As has been indicated previously, delaminations may occur from the edge of a chip 5, at the bonding interface of the handle 21 to the wafer 19, and may propagate as far as a conductive connecting via 33 and damage same.

One embodiment of a method for manufacturing a back-illuminated chip will now be described in relation to FIG. 2.

Figure 2:
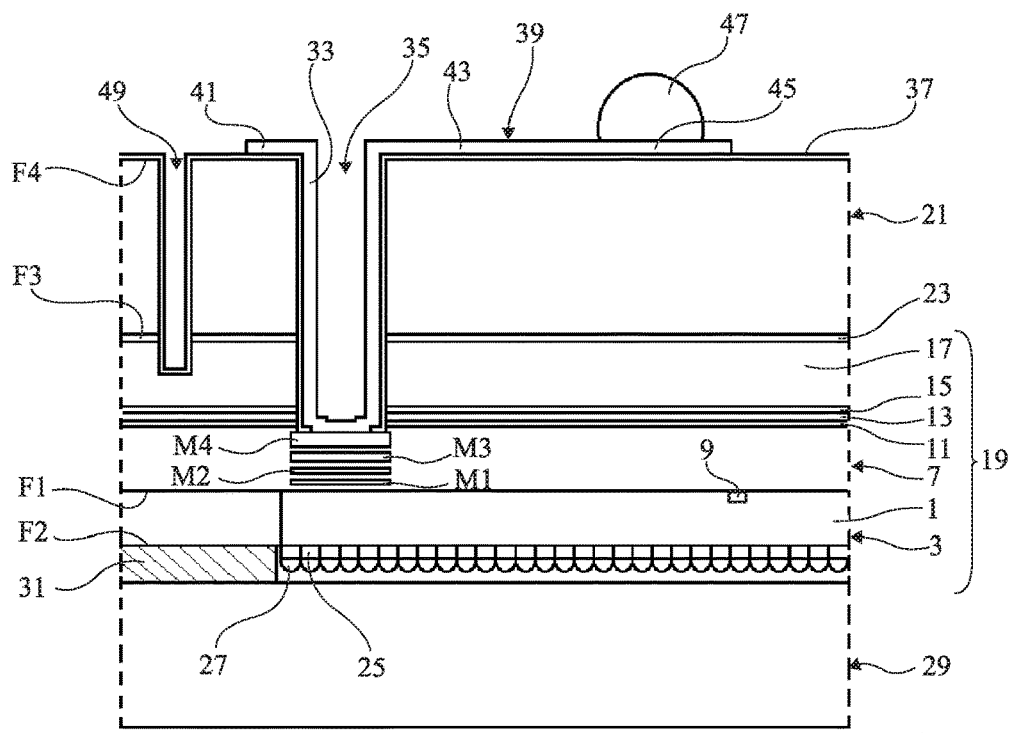
FIG. 2 illustrates an embodiment of a method for manufacturing a back-illuminated chip.

FIG. 2 is a schematic cross-sectional view of the wafer 19 provided with the thinned handle 21 and with the carrier 29 in a step following the step described in relation to FIG. 1C. As is the case for FIGS. 1A to 1D, FIG. 2 shows a portion of only one of the chips 5 forming a part of the semiconductor die 3.

The portion of chip 5 shown in FIG. 2 comprises the same elements as that described in relation to FIG. 1D. Furthermore, an annular trench 49 has been formed by engraving from the upper face F4 of the handle 21. Each chip comprises an annular trench 49 arranged at its periphery so as to surround all of the conductive connecting vias 33 of this chip 5. The trenches 49 extend from the upper face F4 of the handle 21 and pass through the entire thickness of the handle 21. More particularly, the trenches 49 pass through the bonding interface of the handle 21 to the wafer 19, that is to say the interface between the two layers of silicon oxide 17 and 23 in this example. The annular trenches 49 preferably do not penetrate into the interconnection structures 7, which advantageously makes it possible not to cut the electrical connections that are present in these interconnection structures. By way of example, the annular trenches 49 penetrate into the insulating layer 17 over approximately a quarter of its thickness. The width of each trench 49 is for example between 5 and 30 µm.

Advantageously, the trenches 49 are engraved from the upper face F4 of the handle 21 in a step in which it had already been provided to engrave the holes 35 of the vias 33 from this upper face F4.

According to one preferred embodiment, the annular trenches 49 and the holes 35 are advantageously formed during one and the same step of engraving, for example by plasma engraving. For this, an engraving mask comprising apertures at the location of the holes 35 and the trenches 49 is formed on the upper face F4 of the handle 21. The width of the apertures corresponding to the holes 35 is selected so as to be greater than that of the apertures corresponding to the trenches 49, such that the holes 35 are deeper than the trenches 49. Thus, in this embodiment, the manufacturing method that gives the structure in FIG. 2 does not comprise an additional step with respect to the method that gives the structure in FIG. 1D.

According to another embodiment, the trenches 49 are formed during a first step of masking, engraving and removing the mask, and the holes 35 are formed during a second step of masking, engraving and removing the mask. Thus, in this embodiment, the method that gives the structure in FIG. 2 comprises just one additional step of masking/engraving with respect to the method described in relation to FIGS. 1A to 1D. Preferably, the first step of masking/engraving is performed before the second step of masking/engraving in order to prevent portions of the mask from the first step from remaining in the holes 35. Thus, the holes 35 are not contaminated or damaged by the presence of such portions of mask.

Once the holes 35 and the trench 49 have been engraved, the insulating layer 37, the vias 33, and optionally the tracks 43 and the pads 45 are formed in the manner described in relation to FIG. 1D. Thus, after the step of forming the insulating layer 37, the walls and the base of the trench 49 are covered with the insulating layer 37. Furthermore, these steps are carried out for example in such a way that no portion of the conductive layer 39 remains in the trenches once the formation of the vias 33 has been completed.

In a subsequent step that is not illustrated, the wafer 19 provided with the handle 21 and with the transparent carrier 29 is sliced along the contours 51 of each chip 5 in order to obtain a plurality of individualized chips 5, each of which comprises an annular trench 49 at its periphery.

Advantageously, when a delamination occurs from the edge of a chip 5 at the bonding interface of the handle 21 to the wafer 19, this delamination is stopped at the annular trench 49 and is therefore unable to reach a conductive connecting via 33.

Figure 3:
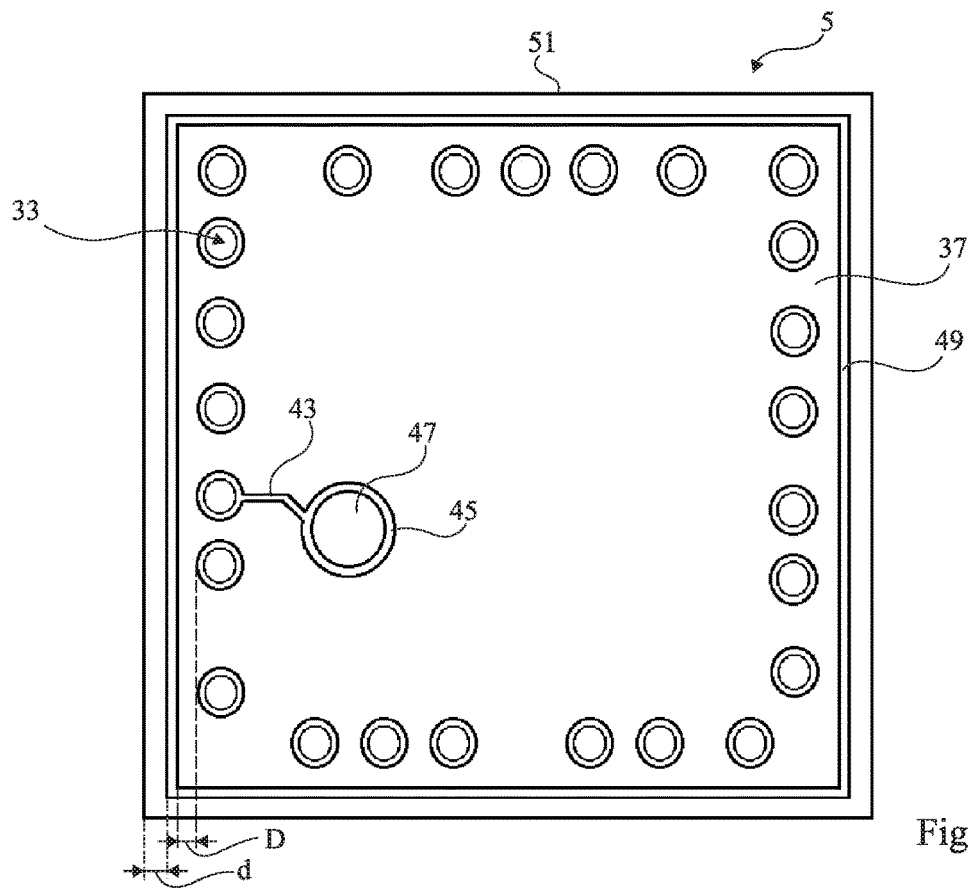
FIG. 3 is a plan view of a chip obtained using the method of FIG. 2.

FIG. 3 is a plan view of a chip 5 having the structure in FIG. 2 after slicing. In this figure, a single track 43, a single pad 45 and a single ball 47 are shown, it being understood that, in practice, the chip comprises several conductive tracks, pads and balls. These pads and balls are organized for example in the form of matrices inside a ring of vias 33.

The annular trench 49 is arranged on the perimeter of the chip 5, that is to say at the periphery of the chip 5, for example at a substantially constant distance d from the edge 51 of the chip 5. This distance d may be between 5 and 30 µm, for example 15 µm. The conductive vias 33 are formed in a central portion of the chip 5 that is delimited by the annular trench 49. A distance D, for example greater than 5 µm, or even greater than 10 µm, separates each via 33 from the trench 49. This distance is chosen to be large enough to prevent portions of the conductive layer 39 from being present in the trench 49 after the formation of the conductive vias 33. By way of example, the chip has a rectangular surface, for example a surface of a few square millimeters, for example approximately 3 mm*2.5 mm.

Specific embodiments have been described. Various variants and modifications will be apparent to a person skilled in the art. In particular, the stack of optional insulating layers 11, 13, 15 and 17 formed on the interconnection structure 7 and to which the handle 21 is bonded may comprise other insulating layers. Conversely, at least some of these optional insulating layers may be omitted.

The number and/or the order of the steps of the method described above in relation to FIGS. 1A to 1C and 2 may be adapted by a person skilled in the art. For example, in the step in which the transparent carrier 39 is bonded to the side of the back face F2 of the semiconductor layer 3, a step of heat or ultraviolet treatment may be provided when the adhesive 31 is made of a polymer material. Furthermore, after the formation of the trenches 49, the vias 33, the tracks 43 and the pads 45, an insulating passivation layer, for example made of resin, may be deposited on the side of the upper face F4 of the handle 21. This passivation layer may then form bridges that close the trenches 49 and the holes 35 at this face F4.

Moreover, the conductive connecting vias 33 formed through the handle 21 may extend as far as portions of an intermediate level of metallization, for example M3 or M2, or of a lower level of metallization, for example M1, of the interconnection structure 7 of the chip.

Although it has not been described, after the step of slicing or sawing the wafer 19 provided with the handle 21 and with the carrier 29, the chip 5 may be mounted on a printed circuit board or an interposer board, each ball 47 then being in contact with a conductive surface of this board.

The semiconductor die may be replaced by an SOI (semiconductor on insulator) die, comprising a semiconductor layer resting on an insulating layer, itself resting on a semiconductor substrate, the semiconductor layer then being on the side of the front face of the SOI die.

The invention claimed is:

1. A method for manufacturing image sensor chips, comprising:
    a) forming a wafer comprising a semiconductor die, interconnection structures arranged on a front face of the semiconductor die, and matrices of pixels formed in the semiconductor die with circuit elements formed at said front face that are connected to said interconnection structures;
    b) bonding a first face of a handle to the wafer facing said interconnection structures;
    c) for each image sensor chip, opening, from a second face of the handle, an annular trench surrounding each matrix of pixels, the annular trench passing through an entire thickness of the handle, wherein the second face is at an opposite side of the handle from the first face; and
    d) slicing the wafer for separating the image sensor chips, wherein an edge of each image sensor chip is located beyond the annular trench of said image sensor chip.

2. The method according to claim 1, further comprising forming the handle to include a first layer of silicon oxide at the first face, and wherein step c) further comprises opening each annular trench to extend completely through the first layer of silicon oxide.

3. The method according to claim 2, further comprising forming the wafer to include a second layer of silicon oxide; and wherein step b) further comprises bonding the first layer of silicon oxide to the second layer of silicon oxide; and wherein step c) further comprises opening the annular trench to extend completely through the first layer of silicon oxide and at least partly through a thickness of the second layer of silicon oxide.

4. The method according to claim 1, further comprising forming the wafer to include a layer of silicon oxide; wherein step b) further comprises bonding the handle to the layer of silicon oxide; and wherein step c) further comprises opening the annular trench to extend at least partly through a thickness of the layer of silicon oxide.

5. The method according to claim 1, further comprising forming conductive vias by:
    for each image sensor chip, opening holes from the second face of the handle to reach portions of a level of metallization of the interconnection structures;
    forming an insulating layer on the second face of the handle, said insulating layer covering walls and bases of the holes and of the annular trench;
    removing portions of the insulating layer at the base of each hole; and
    forming a conductive layer on the walls and the base of each hole.

6. The method according to claim 5, wherein the annular trench and the holes are opened simultaneously.

7. The method according to claim 1, wherein a depth of the annular trench does not reach the interconnection structures.

8. The method according to claim 1, further including thinning the semiconductor die from a back face of the semiconductor die after bonding of the handle.

9. The method according to claim 8, further including bonding a transparent carrier to the wafer on a side of the back face of the thinned semiconductor die.

10. A method, comprising:
    a) forming a wafer which includes a semiconductor substrate, integrated circuits for a plurality of pixel arrays located in the semiconductor substrate and an interconnection layer arranged over the semiconductor substrate;
    b) bonding a first face of a handle to the interconnection layer;
    c) opening, from a second face of the handle, a plurality of annular trenches, wherein each annular trench surrounds a corresponding one of the pixel arrays and passes completely through a thickness of the handle, wherein the second face is at an opposite side of the handle from the first face; and
    d) slicing the wafer and handle to form a plurality of image sensor chips, each image sensor chip including one of the pixel arrays, and wherein a peripheral edge of each image sensor chip surrounds and is offset from a corresponding annular trench.

11. The method according to claim 10, further comprising forming the handle to include a first layer of silicon oxide at the first face to assist with bonding the handle to the interconnection layer, and wherein step c) further comprises opening the annular trenches to extend completely through the first layer of silicon oxide.

12. The method according to claim 10, further comprising forming the wafer to include a first layer of silicon oxide and forming the handle to include a second layer of silicon oxide at the first face; wherein step b) further comprises bonding the first layer of silicon oxide and second layer of silicon oxide to each other when bonding the handle to the interconnection layer of the wafer; and wherein step c) further comprises opening the annular trenches completely through the second layer of silicon oxide and at least partly through a thickness of the first layer of silicon oxide.

13. The method according to claim 10, further comprising forming the interconnection layer to include a layer of silicon oxide; wherein step b) further comprises bonding the handle to the layer of silicon oxide; and wherein step c) further comprises opening the annular trenches at least partly through a thickness of the layer of silicon oxide.

14. The method according to claim 10, further comprising forming conductive vias which extend completely through the handle to reach portions of a level of metallization of the interconnection layer.

15. The method according to claim 14, wherein forming the conductive vias comprises:
    opening holes from the second face of the handle to reach the level of metallization;

forming an insulating layer covering walls and a base of each of the holes;

removing portions of the insulating layer at the base of each of the holes; and forming a conductive layer on the walls and the base of each of the holes.

16. The method according to claim 15, wherein the annular trenches and the holes are opened simultaneously.

17. The method according to claim 15, wherein a depth of each annular trench does not reach the interconnection layer.

18. The method according to claim 10, further including thinning the semiconductor substrate from a back face of the semiconductor substrate after bonding of the handle.

19. The method according to claim 10, wherein opening comprises engraving into the second face of the handle to open the plurality of annular trenches.

20. A method, comprising:

forming a wafer which includes a semiconductor substrate, integrated circuits for a plurality of pixel arrays located in the semiconductor substrate, an interconnection structure arranged over the semiconductor substrate and a first bonding layer arranged over the interconnection structure which provides a first bonding surface;

forming a handle which includes a semiconductor layer having a back surface and a front surface and a second bonding layer at the front surface which provides a second bonding surface;

bonding the first bonding surface to the second bonding surface so as to attach the handle to the wafer;

engraving into the semiconductor layer at the back surface to open a plurality of annular trenches, wherein each annular trench surrounds a corresponding one of the pixel arrays and passes completely through a thickness of both the second bonding layer and semiconductor layer of the handle; and slicing the wafer and handle to form a plurality of image sensor chips, each image sensor chip including one of the pixel arrays, and wherein a peripheral edge of each image sensor chip surrounds and is offset from a corresponding annular trench.

21. The method according to claim 20, wherein the first bonding layer is a first layer of silicon oxide.

22. The method according to claim 20, wherein the first bonding layer is a first layer of silicon oxide and the second bonding layer is a second layer of silicon oxide; and wherein bonding comprises bonding the first layer of silicon oxide and second layer of silicon oxide to each other.

23. The method according to claim 20, wherein engraving comprises extending the plurality of annular trenches to a depth which passes only partly through a thickness of the first bonding layer.

24. The method according to claim 20, further comprising forming conductive vias from the back surface of the semiconductor layer which extend completely through the thickness of the second bonding layer and semiconductor layer of the handle and further completely through a thickness of the first bonding layer to reach portions of a level of metallization of the interconnection structure.

25. The method according to claim 24, wherein forming the conductive vias comprises:

opening holes from the back surface of the semiconductor layer to reach the level of metallization;

forming an insulating layer covering walls and a base of each of the holes;

removing portions of the insulating layer at the base of each of the holes; and forming a conductive layer on the walls and the base of each of the holes.

26. The method according to claim 25, wherein the engraving to open the plurality of annular trenches and the opening of the holes are performed simultaneously.

27. The method according to claim 25, wherein a depth of each annular trench does not reach the interconnection structure.

28. The method according to claim 20, further including thinning the semiconductor substrate after bonding of the handle.

* * * * *